United States Patent [19]
Egawa

[11] Patent Number: 5,877,989
[45] Date of Patent: Mar. 2, 1999

[54] SEMICONDUCTOR MEMORY DEVICE

[75] Inventor: Noboru Egawa, Tokyo, Japan

[73] Assignee: Oki Electric Industry Co., Ltd., Tokyo, Japan

[21] Appl. No.: 951,658

[22] Filed: Oct. 16, 1997

Related U.S. Application Data

[62] Division of Ser. No. 449,951, May 25, 1995, Pat. No. 5,699,301, which is a division of Ser. No. 306,916, Sep. 16, 1994, Pat. No. 5,500,614.

[30] Foreign Application Priority Data

Sep. 22, 1993 [JP] Japan ................................. 5-236879

[51] Int. Cl.$^6$ ............................ G06F 13/00; H03F 3/40
[52] U.S. Cl. .................... 365/189.05; 327/107; 327/191; 327/53
[58] Field of Search ..................... 365/189.05, 189.01; 327/107, 191, 53

[56] References Cited

U.S. PATENT DOCUMENTS

| | | | |
|---|---|---|---|
| 5,266,848 | 11/1993 | Nakagone et al. | 307/475 |
| 5,398,318 | 3/1995 | Hiraishi et al. | 395/250 |
| 5,500,614 | 3/1996 | Egawa | 327/107 |
| 5,557,221 | 9/1996 | Taguchi et al. | 327/53 |
| 5,629,640 | 5/1997 | Egawa | 365/189.05 |
| 5,699,301 | 12/1997 | Egawa | 365/189.05 |

*Primary Examiner*—Viet Q. Nguyen
*Attorney, Agent, or Firm*—Rabin & Champagne, P.C.

[57] ABSTRACT

A semiconductor memory device capable of reducing a delay in the conversion of an input chip enable signal having a TTL level, providing a quick chip enable access and avoiding an increase in current consumption even when the quick chip enable access is made possible. The semiconductor memory device in one embodiment includes an input buffer outputting a signal having a CMOS level in response to a chip enable signal having a TTL level and having a plurality of transistors whose gate widths are set to first dimensions and a second input buffer activated in response to both an input signal having a TTL level other than the chip enable and the signal having the CMOS level and having a plurality of transistors whose gate widths are set to second dimensions smaller than the first dimensions. Further, a semiconductor memory device in another embodiment includes an input buffer outputting a signal having a CMOS level in response to a chip enable signal having a TTL level and having a plurality of transistors whose gate widths are set to first dimensions and a second input buffer activated in response to both an input signal having a TTL level other than the chip enable signal and the signal having the CMOS level and having a plurality of transistors whose gate widths are set to second dimensions smaller than the first dimensions.

14 Claims, 4 Drawing Sheets

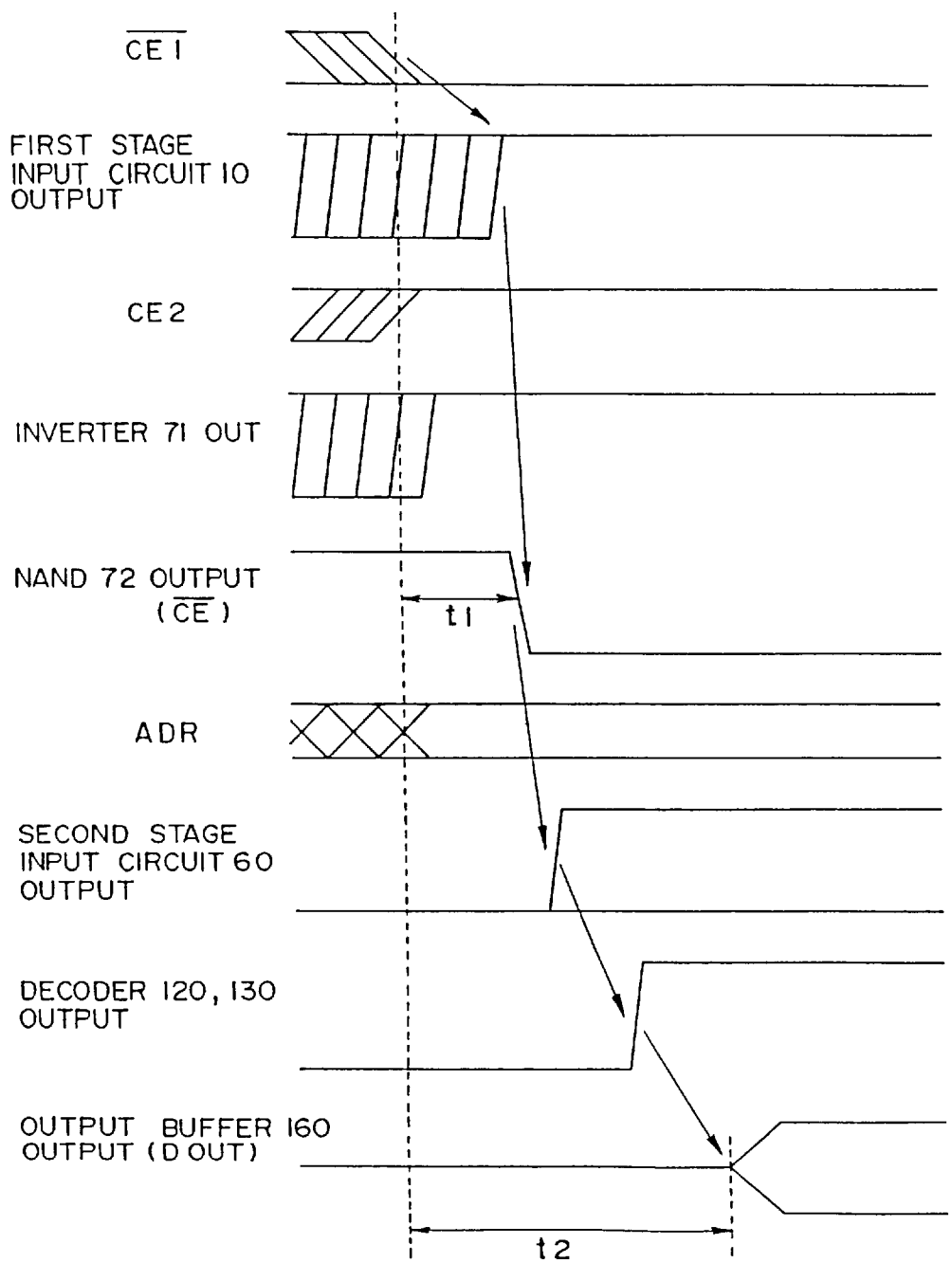

5,877,989

SEMICONDUCTOR MEMORY DEVICE

This is a Division of application Ser. No. 08/449,951, filed May 25, 1995, now U.S. Pat. No. 5,699,301, which is a Division of application Ser. No. 08/306,916, filed Sep. 16, 1994, now U.S. Pat. No. 5,500,614.

CROSS REFERENCE TO RELATED APPLICATION

This application claims rights of priority under 35 USC §119 of Japanese Patent Application Serial No. 5-236879, filed Sep. 22, 1993, the entire disclosure of which is incorporated herein by reference.

BACKGROUND OF THE INVENTION

An input buffer included in a conventional SRAM will be described with reference to FIG. 1.

The input buffer serves as a circuit for converting a signal having a TTL (Transistor Transistor Logic) level to a signal having a CMOS (Complementary MOS) level. The input buffer comprises CMOS transistors. Described specifically, the input buffer comprises a PMOS transistor (hereinafter also "PMOS") 1 whose source is electrically connected to a power source potential VCC, an NMOS transistor (hereinafter also "NMOS") 2 whose source is electrically connected to a ground potential VSS and an inverter 3. The signal having the TTL level is input to the gates of the PMOS 1 and the NMOS 2.

FIG. 2(a) shows the voltage of a signal having a TTL level, which is represented as an input signal. FIG. 2(b) shows the voltages of a signal having a CMOS level, which is represented as an output signal.

The operation of the input buffer shown in FIG. 1 will now be described with reference to FIGS. 2(a) and 2(b).

When a signal having a TTL level of 0.8 V is first input to the input buffer as an input signal having an "L" level, the PMOS 1 is turned on and the NMOS 2 is turned off. As a result, the level of a signal output from the input buffer through the inverter 3 is brought to the ground potential VSS (0 V), for example.

When a signal having a TTL level of 2.2 V is input to the input buffer as an input signal having an "H" level, the NMOS 2 is brought into a conducting state. Thus, the level of a signal output from the input buffer through the inverter 3 is brought to a power source potential VCC (5 V), for example. As a result, a signal having the TTL level is converted to a signal having the CMOS level as shown in FIGS. 2(a) and 2(b).

SUMMARY OF THE INVENTION

It is an object of the present invention to provide a semiconductor memory which is device capable of reducing a delay in the conversion of an input chip enable signal having a TTL level, providing a quick chip enable access and avoiding an increase in current consumption even though the quick chip enable access is made possible.

In order to achieve the above object, a semiconductor memory device according to the invention comprises an input buffer outputting a signal having a CMOS level in response to a chip enable signal having a TTL level, wherein the input buffer has a plurality of transistors whose gate lengths are set to first dimensions. The memory device also comprises a second input buffer activated in response to both another input signal having a TTL, level and the signal having the CMOS level, wherein the second buffer has a plurality of transistors whose gate lengths are set to second dimensions greater than the first dimensions. Further, a semiconductor memory device according to the invention comprises an input buffer outputting a signal having a CMOS level in response to a chip enable signal having a TTL level, wherein the input buffer has a plurality of transistors whose gate widths are set to first dimensions. The memory device also comprises a second input buffer activated in response to both another input signal having a TTL level, and the signal having the CMOS level, wherein the second input buffer has a plurality of transistors whose gate widths are set to second dimensions smaller than the first dimensions.

BRIEF DESCRIPTION OF THE DRAWINGS

FIG. 4 is a view for describing the operation of the semiconductor memory device shown in FIG. 3.

DETAILED DESCRIPTION OF THE PREFERRED EMBODIMENT

The present invention has been achieved based on the ideas and foundations to be described later.

A input buffer for converting a signal having a TTL level to a signal having a CMOS level can provide a high-speed converting operation owing to an increase in the dimensions of the gate widths of the transistors which form the input buffer. However, the current consumption of the input buffer increases with an increase in the dimensions of the gate widths. Therefore, the dimensions of the gate widths of the transistors forming a plurality of input buffers included in a semiconductor memory device have been varied in consideration of performance priorities. Thus, the construction of a semiconductor memory device which is capable of providing a high-speed converting operation and cable of decreasing the current consumption has been derived from the result of such a process.

Factors for determining performance will be described below in detail.

Figure 1:
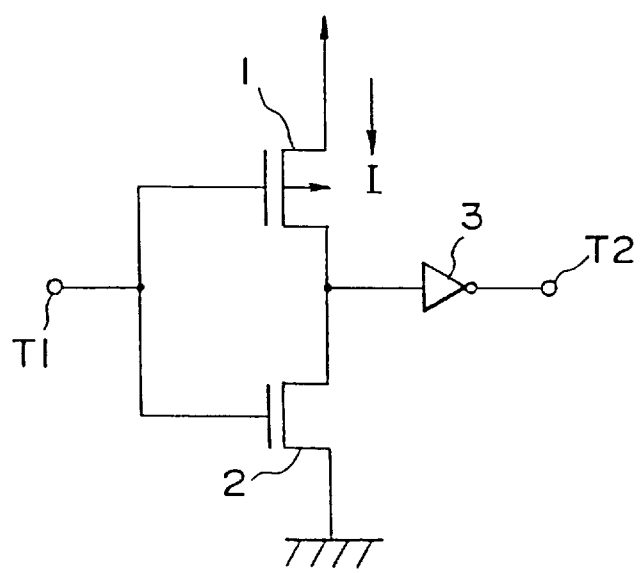
FIG. 1 is a schematic view showing a conventional input buffer.
Figure 2A:
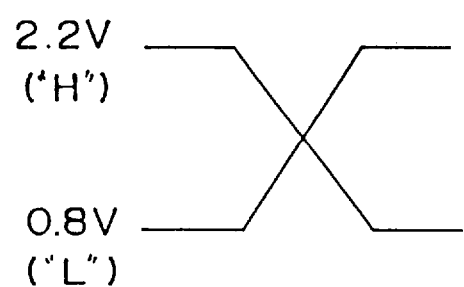
FIGS. 2A and 2B show a view for describing the operation of the conventional input buffer shown in FIG. 2.
Figure 2B:
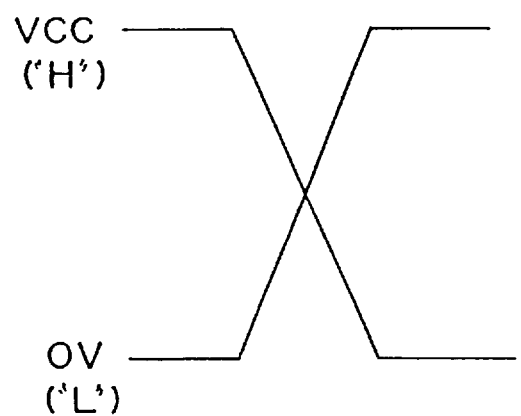

Let us now consider the factors for determining the operating speed. There are some cases where the speed for converting a signal having a TTL level to a signal having a CMOS level varies depending on how the potential level of the input signal varies. When a change from "L" to "H" of the potential level of the input signal having the TTL level is compared with a change of the potential level thereof from "H" to "L", the latter change requires an increased period of time to convert the signal having the TTL level to the signal having the CMOS level. This is because an input potential corresponding to "H" of the signal having the TTL level is lower than an input potential corresponding to "H" of the signal having the CMOS level owing to the fact that the input buffer comprised of a CMOS circuit unbalances the performance of PMOS and NMOS transistors to make it easy to detect "H" of the signal having the TTL level. Such a situation will be described with reference to FIG. 1, for example. If a CMOS level is input as an input voltage when the semiconductor memory device is activated by a power source voltage of 5 V, then the level of the input voltage is set to "H" or "L" with 2.5 V corresponding to one-half the power source voltage as the center. Therefore, PMOS 1 and NMOS 2 are substantially identical in performance to each other and produce outputs at the same speed regardless of whether the level of the input voltage is "H" or "L". However, if a TTL level is input as an input voltage, then the level of the input voltage is set to "H" and "L" with 1.5 V as the center. Therefore, the PMOS 1 transistor 1 is reduced in performance as compared with the NMOS transistor 2. Accordingly, the speed required to output "H" becomes slow and the speed required to output "L" becomes fast. Namely, when the input having the TTL level changes from "L" to "H", the output speed becomes faster.

Let's next consider factors for determining the current consumption. When a potential level of an input signal having a TTL level is "H" or "L", a stationary current which flows in the input buffer, often varies. When the potential level of the input signal having the TTL level is "H", the stationary current which flows in the input buffer, increases as compared with the case where the potential level of the input signal is "L". This is because the current continues flowing due to the fact that when the potential level of the input signal having the TTL level is "H", its potential level is lower than the power source voltage applied to the CMOS circuit and the PMOS forming the input buffer is not fully turned off. This situation will be described with reference to FIG. 1, for example. When a potential level "H" (2.2 V) is input to an input $T_1$ as the input signal having the TTL level, the NMOS 2 is turned on because the source and gate thereof have been supplied with a ground level voltage GND (0 V) and 2.2 V respectively. Since the source and gate of the PMOS 1 are respectively supplied with a power source voltage VCC (5 V) and 2.2 V, the PMOS 1 is not turned off. Therefore, the current flows in the PMOS 1.

As other factors for determining performance include the order and timing used for each input signal.

It is apparent from the above description that increasing the output speed and controlling an increase in current consumption, which takes place with an increase in the output speed, can be achieved by setting the gate width of transistors forming an input buffer which is supplied with a chip enable signal of a negative logic so as to be wider than the after width dimensions of transistors forming an input buffer which is supplied with other input signals (such as a chip enable signal of a positive logic, an address signal, a data input, a write enable signal or an output enable signal) or setting the gate length dimensions so as to be shorter than those of the gate length of the transistors forming the input buffer supplied with the input signals described above.

The semiconductor memory device will now be described specifically by taking a SRAM as an example.

In the semiconductor memory device, particularly a low current consumption type SRAM, a chip select operation causes a delay in the operation of the SRAM itself. This is because a chip enable signal brings an inner circuit, including input buffers each supplied with an address signal and a memory cell array, into a non-selecting state to reduce the current consumption at the time that a chip is in a non-selected state and thereafter the SRAM starts to operate for chip selection after the chip enable signal has been input. The operation for taking the chip enable signal in the SRAM is made faster to increase the operation of the SRAM itself. Further, when a negative-logic chip enable signal performs a changeover of the chip from a non-selected state to a selected state, a change of the potential level of the input from "H" to "L" is slow. Therefore, the SRAM needs to operate at a higher speed in order to make the change in the level of the input faster. Thus, the priority given for increasing the dimensions of the gate widths of the transistors forming the input buffer is highest. Since the chip enable signal is brought to "L" upon selecting the chip, the current which flows upon the operation of the SRAM, hardly increases even if the dimensions of the gate widths are made greater. Therefore, the current consumption can be lowered. Even in the case of non-selection of the chip, there is no current increase so long as a signal having the CMOS level is input. When positive-logic and negative-logic chip enable signals are input, the positive-logic chip enable signal is used so as to deactivate the input buffer supplied with the negative-logic chip enable signal. When this is done, an increase in the current consumption does not occur even in the case where a signal having the TTL level is input.

Let's now consider the positive-logic chip enable signal. In this case, the positive-logic chip enable signal becomes faster in operation than the negative-logic chip enable signal, upon changing the potential level of the input from "L" to "H" to switch the chip from the non-selected state to the selected state. Therefore, the priority given for increasing the dimensions of the gate widths of the transistors forming the input buffer is a second priority. Since the potential level of the input positive-logic chip enable signal is brought to "H" upon selecting the chip, the current which flows when the SRAM is operated increases if the dimensions of the gate widths are enlarged. It is therefore not possible to increase their dimensions.

Let's next consider the address signal. Since the address signal is input to the input buffer after the chip has been selected by a chip enable signal, the priority level given for increasing the dimensions of the gate widths of the transistors forming the input buffer is a third priority. The more the dimensions increase, the more the current that flows when the SRAM is operated, increases.

Let's further consider the data input, the write enable signal and the output enable signal. Since the data input, the write enable signal and the output enable signal are needed after the address signal has been determined, the priority level given for increasing the dimensions of the gate widths of the transistors forming the input buffer is lowered as compared with the priority levels determined upon using the negative-logic and positive-logic chip enable signals and the address signal. It is therefore necessary to decrease their dimensions and reduce the current flowing upon the operation of the SRAM.

A semiconductor memory device according to the present invention will now be described in more detail with reference to FIG. 3.

The semiconductor memory device is a SRAM comprised of CMOSs, for example, which are selectively activated based on a plurality of chip enable signals.

Figure 3:
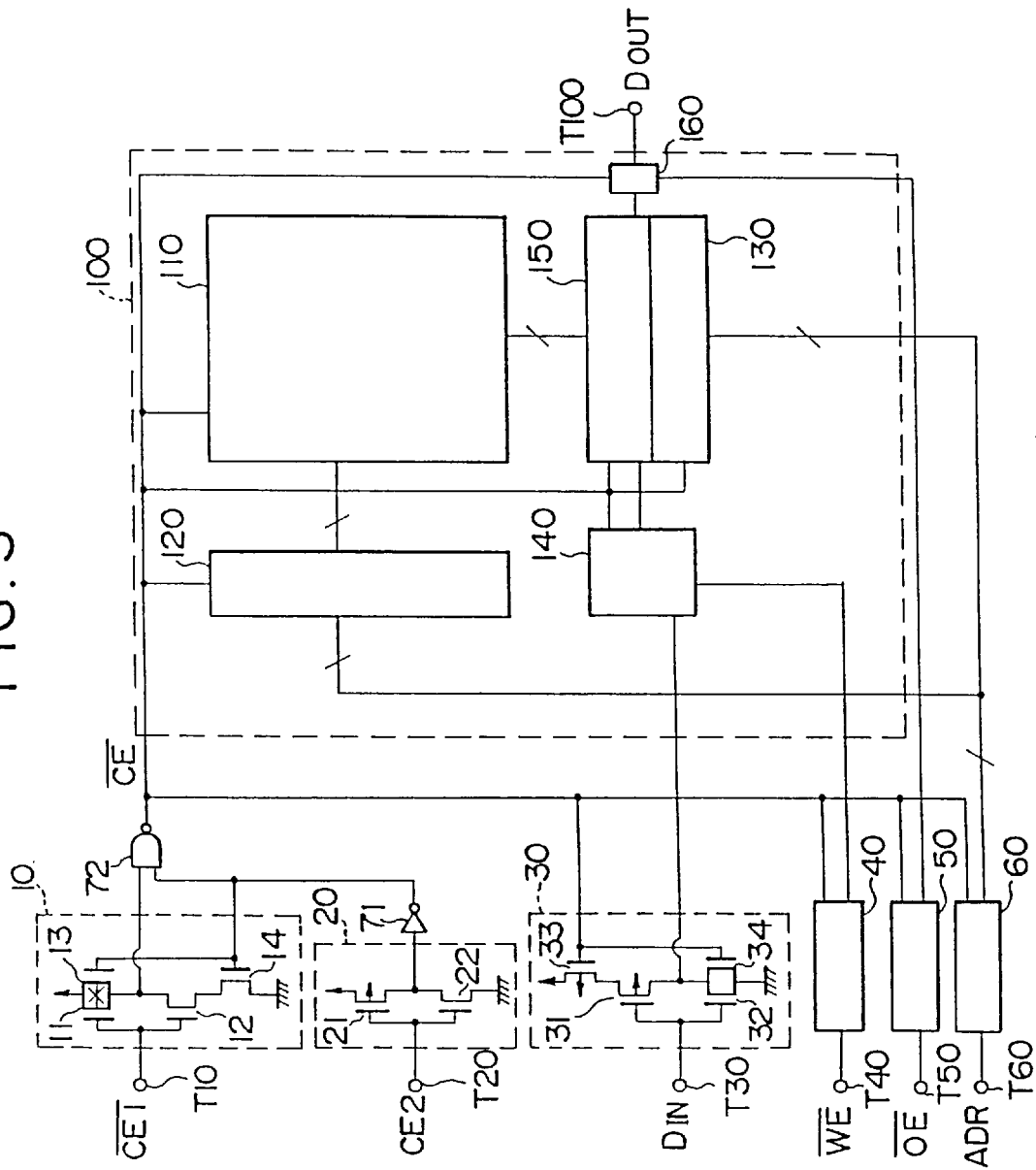
FIG. 3 is a block diagram showing the structure of a semiconductor memory device according to the present invention.

The semiconductor memory device shown in FIG. 3 comprises an input buffer 10 for selectively converting a negative-logic chip enable signal $\overline{CE1}$ having a TTL level to a signal having a CMOS level, an input buffer 20 for receiving therein a positive-logic chip enable signal CE2 corresponding to a signal complementary to the signal $\overline{CE1}$ when the semiconductor memory device is in operation, an input buffer 30 activated so as to transfer input data $D_{in}$, an input buffer 40 for receiving a negative-logic write enable signal $\overline{WE}$ therein, an input buffer 50 for receiving a negative-logic output enable signal $\overline{OE}$ therein and an input buffer unit having a plurality of input buffers for receiving addresses ADR for a memory cell array therein.

Further, the semiconductor memory device according to the present invention is also provided with a NAND circuit 72. The NAND circuit 72 activates each of the input buffers 30, 40, 50 and 60 in response to the output of the input buffer 10, and the output of the input buffer 20, which is supplied to the NAND circuit 72 via an inverter 71.

Further, the semiconductor memory device according to the present invention includes an inner circuit 100 activated in response to signals input thereto from the input buffers 30, 40, 50 and 60. The inner circuit 100 comprises a memory cell array 110 for the SRAM, a row address decoder 120, a column address decoder 130, an input data control circuit 140, a R/W input/output circuit 150 and a data output buffer 160. The memory cell array 110 for the SRAM is comprised of CMOSs or NMOSs and retains data therein. The row address decoder 120 decodes a row address. The column address decoder 130 decodes a column address. The input data control circuit 140 performs switching of the data Din supplied from the input buffer 30. The R/W input/output circuit 150 inputs write data or read data to a memory cell selected by the decoders 120 and 130 and outputs the write or read data from the memory cell. The data output buffer 160 is activated in response to the output enable signal $\overline{OE}$, the chip enable signal $\overline{CE}$ and the write enable signal $\overline{WE}$ and outputs read data to the outside based on these signals.

The input buffer 10 is comprised of a two input NAND gate and is supplied with the chip enable signal $\overline{CE1}$ having the TTL level from an input terminal T10. The input buffer 10 converts the signal $\overline{CE1}$ having the TTL level to a signal having a CMOS level.

The input buffer 10 comprises a PMOS 11 and an NMOS 12 and a PMOS 13 and an NMOS 14 which form CMOSs. The gates of the PMOS 11 and the NMOS 12 are electrically connected to each other and to input terminal T10. Further, the drains of the PMOS 11 and the NMOS 12 are electrically connected to each other. The source of the PMOS 11 is electrically connected to a power source VCC. The source of the PMOS 13 is electrically connected to the power source VCC in parallel with the source of the PMOS 11. The source of the NMOS 14 is electrically connected to a ground potential VSS. The drains of the PMOS 13 and the NMOS 14 are electrically connected to each other through the NMOS 12.

The input buffer 20 serves as a circuit for receiving therein the signal CE2 having the TTL level, which has been inverted with respect to the chip enable signal $\overline{CE1}$ upon selecting the chip and converting the level of the signal CE2 to a CMOS level. The input buffer 20 is made up of a CMOS inverter comprised of a PMOS 21 and an NMOS 22.

The input buffer 30 comprises a NAND gate having two inputs, one of which is supplied with the data Din having the TTL level through an input terminal T30 and the other of which is supplied with the signal $\overline{CE}$ output from the NAND circuit 72. The input terminal T30 is electrically connected to the gate electrodes of a PMOS 31 and an NMOS 32 whose drains are electrically connected to each other. The source of the NMOS 32 is electrically connected to the ground potential VSS. The output of the NAND circuit 72 is input to the gate electrodes of other PMOS 33 and NMOS 34 in common. The source of the NMOS 34 is electrically connected to the ground potential VSS in parallel with the source of the NMOS 32. The source of the PMOS 33 is electrically connected to the power source VCC. The drains of the PMOS 33 and the NMOS 34 are electrically connected to each other through the PMOS 31. Each of the input buffers 40, 50 and 60 for respectively converting the write enable signal $\overline{WE}$, the output enable signal $\overline{OE}$ and the addresses ADR each having the TTL level to the CMOS levels, is identical in structure to the input buffer 30. Further, the input buffers 40, 50 and 60 respectively have transistors 41 through 44, transistors 51 through 54 and transistors 61 through 64.

The dimensions of the respective transistors 11 through 14 in the input buffer 10 are set so as to be larger than the dimensions of the transistors 21 and 22 in the input buffer 20 or the dimensions of the transistors 31 through 34, 41 through 44, 51 through 54 and 61 through 64 in the input buffers 30 through 60. Namely, the gate widths of the respective NMOSs or PMOSs in the input buffer 10 are set larger than those of the respective NMOSs and PMOSs in each of the input buffers 20 through 60 or the gate lengths thereof are set shorter than those thereof to increase the current that flows in the transistors.

The operation of the semiconductor memory device according to the present invention, which is shown in FIG. 3, will now be described below with reference to FIG. 4.

Upon selecting the chip, a TTL level "L" is input to a $\overline{CE1}$ terminal and a TTL level "H" is input to a CE2 terminal. Further, the TTL level "H" or "L" is input to each of the ADR, $D_{in}$, $\overline{WE}$ and $\overline{OE}$ terminals. When the TTL level "L" is first input to the $\overline{CE1}$ terminal, an "H" converted to CMOS level is produced as the output of the input buffer 10. Similarly, when the TTL level "H" is input to the CE2 terminal, an "L" converted to a CMOS level is produced as the output of the input buffer 20 and is brought to an "H" by the inverter 71.

Since the potential level input to the input buffer 20 changes from the "L" to the "H", the speed of converting the input potential level from the TTL level to the CMOS level by the input buffer 20 is faster than that by the input buffer 10. The NAND circuit 72 outputs an "L" as the output $\overline{CE}$ in synchronism with either one of the outputs produced from the input buffer 10 and the inverter 71, which is delayed in phase between the two. When a chip select signal is simultaneously input to the $\overline{CE1}$ and CE2 terminals, the NAND circuit 72 outputs an "L" in synchronism with the output of the input buffer 10. Thus, the output "L" is supplied to the NAND circuit 72 at rapid speed in the case of the present invention in which the speed at which the output of the input buffer 10 is produced has been increased. A time interval t1 in FIG. 4 becomes faster or shorter. The output signal "L" of the NAND 72 is input to each of the PMOSs 33, 43, 53 and 63 of the input buffers 30, 40, 50 and 60, so that the respective input buffers are activated. The outputs of the activated input buffers 30, 40, 50 and 60 are sent to their corresponding circuits in the inner circuit 100. As a result, the semiconductor memory device is operated so as to write data into a corresponding memory cell and read it therefrom.

During the read operation, the addresses ADR are input to the row address decoder 120 and the column address decoder 130. A one bit memory cell is selected from the memory cell array 110 based on the results of decoding the input addresses ADR. Data stored in the selected memory cell is supplied to the R/W input/output circuit 150. Next, the data is output to the outside through the data output buffer 160. Here, a chip enable access time corresponds to a time interval t2 in the drawing. During the write operation, the addresses ADR are input to the row address decoder 120 and the column address decoder 130. Based on the results of decoding the input addresses ADR, a one-bit memory cell is selected from the memory cell array 110. The data $D_{in}$ is input to the input data control circuit 140 where it is controlled based on the write enable signal $\overline{WE}$. The so-processed data $D_{in}$ is next sent to the R/W input/output circuit 150 where it is written into its corresponding memory cell selected from the memory cell array 110.

When the chip is in a non-selected state, an "H" is input to the chip enable signal $\overline{CE1}$ terminal. Alternatively, an "L" is input to the chip enable signal CE2 terminal. Therefore, each of the input buffers 30, 40, 50 and 60 and the inner circuit 100 is brought into a deactivating state. When the "L" is input to the chip enable signal CE2 terminal, the input buffer 10 is also brought into the deactivating state.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A semiconductor memory device comprising:
   a first input buffer outputting a first signal having a CMOS level in response to a negative-logic chip enable signal having a TTL level and having a plurality of transistors whose gate widths are set to first dimensions; and
   a second input buffer outputting a second signal having a CMOS level in response to a positive-logic chip enable signal having a TTL level and having a plurality of transistors whose gate widths are set to second dimensions smaller than said first dimensions.

2. The semiconductor memory device as claimed in claim 1, further including an inner circuit activated in response to the first and second signals each having the CMOS level and having a memory cell array.

3. The semiconductor memory device as claimed in claim 1, further including a third input buffer activated in response to the first and second signals each having the CMOS level.

4. A semiconductor memory device comprising:
   a first input buffer outputting a first signal having a CMOS level in response to a negative-logic chip enable signal having a TTL level and having a plurality of transistors whose gate widths are set to first dimensions;
   a second input buffer outputting a second signal having a CMOS level in response to a positive-logic chip enable signal having a TTL level and having a plurality of transistors whose gate widths are set to second dimensions smaller than said first dimensions; and
   a third input buffer activated in response to the first and second signals each having the CMOS level and having a plurality of transistors whose gate widths are set to third dimensions smaller than said second dimensions.

5. The semiconductor memory device as claimed in claim 4, further including an inner circuit activated in response to the first and second signals each having the CMOS level and having a memory cell array.

6. The semiconductor memory device as claimed in claim 1, further comprising means for applying the second signal to said first input buffer, said first input buffer outputting the first signal in response to the negative logic chip enable signal only when the second signal has a predetermined digital state.

7. A semiconductor memory device comprising:
   a first input buffer having a first input terminal which receives a negative logic TTL level chip enable signal and having a first output terminal which provides a first CMOS level output signal, the first input buffer additionally having a plurality of MOS transistors whose gate widths are set to first dimensions;
   a second input buffer having a second input terminal which receives a positive logic TTL level chip enable signal and having a second output terminal which provides a second CMOS level output signal, the second input buffer including a plurality of MOS transistors whose gate widths are set to second dimensions smaller than the first dimensions; and
   means for generating a CMOS level chip enable signal from the first and second CMOS level output signals.

8. A semiconductor memory device as claimed in claim 7, wherein the MOS transistors of the first input buffer include a transistor which is turned on or off in accordance with the second CMOS level output signal.

9. A semiconductor memory device as claimed in claim 8, wherein the means for generating comprises a gate having an input terminal which receives one of the first and second CMOS level output signals and another input terminal which receives the other of the first and second CMOS level input signals in inverted form, the gate additionally having an output terminal which provides the CMOS level chip enable signal.

10. A semiconductor memory device as claimed in claim 8, wherein the means for generating comprises an inverter having an input terminal which is connected to the second output terminal and having an output terminal which is connected to the transistor of the first input buffer which is turned on or off in accordance with the second CMOS level output signal.

11. A semiconductor memory device as claimed in claim 10, wherein the means for generating further comprises a gate having an input terminal which is connected to the first output terminal and having another input terminal which is connected to the output terminal of the inverter, the gate additionally having an output terminal which provide the CMOS level chip enable signal.

12. A semiconductor memory device in accordance with claim 11, further comprising an inner circuit which receives the CMOS level chip enable signal, the inner circuit including a memory cell array.

13. A semiconductor memory device in accordance with claim 12, further comprising another input buffer which receives a TTL level input signal and the CMOS level chip enable signal, and which generates a TTL level output signal that is supplied to the inner circuit.

14. A semiconductor memory device in accordance with claim 7, further comprising an inner circuit which receives the CMOS level chip enable signal, the inner circuit including a memory cell array.

* * * * *